(12) United States Patent
Fournier et al.

(10) Patent No.: US 8,618,741 B2
(45) Date of Patent: Dec. 31, 2013

(54) LIGHT EMITTING DIODE WITH OSCILLATOR

(75) Inventors: Bernard Fournier, Delson (CA); Hao Kang, Chongqin (CN)

(73) Assignee: Winvic Sales Inc., Markham, Ontario (CA)

( * ) Notice: Subject to any disclaimer, the term of this patent is extended or adjusted under 35 U.S.C. 154(b) by 421 days.

(21) Appl. No.: 13/005,370

(22) Filed: Jan. 12, 2011

(65) Prior Publication Data
US 2012/0176033 A1      Jul. 12, 2012

(51) Int. Cl.
*H05B 37/00* (2006.01)

(52) U.S. Cl.
USPC ........................................... 315/291; 315/363

(58) Field of Classification Search
USPC ................. 315/291, 307, 308, 246, 312, 363, 315/227 R, 185 R, 228, 160, 161, 167; 257/88, 89, 79
See application file for complete search history.

(56) References Cited

U.S. PATENT DOCUMENTS

| | | | |
|---|---|---|---|
| 7,402,961 B2 * | 7/2008 | Bayat et al. .................... | 315/295 |
| 2006/0138443 A1 | 6/2006 | Fan et al. | |
| 2008/0180036 A1 * | 7/2008 | Garrity et al. ............. | 315/227 R |
| 2008/0211428 A1 * | 9/2008 | Bayat et al. .................... | 315/299 |
| 2009/0294782 A1 | 12/2009 | Peng | |

FOREIGN PATENT DOCUMENTS

| | | |
|---|---|---|
| GB | 2229857 A | 10/1990 |
| WO | WO 2006/023149 A2 | 3/2006 |

OTHER PUBLICATIONS

PCT International Searching Authority, Notification Concerning Transmittal of the International Search Report and the Written Opinion of the International Searching Authority, or the Declaration, in International application No. PCT/CA2011/001160, dated Jan. 16, 2012. (15 pages).

* cited by examiner

*Primary Examiner* — David H Vu
(74) *Attorney, Agent, or Firm* — McAndrews, Held & Malloy, Ltd.

(57) ABSTRACT

According to embodiments of the present invention, an LED assembly includes a case that encapsulates a post, an anvil and an integrated circuit. The integrated circuit includes positive and negative power supply inputs. The positive power supply input is electrically connected to the post, whereas the negative power supply input is electrically connected to the anvil. The integrated circuit also includes an oscillator input, and an oscillator output. According to these embodiments, an anode lead connected to the post; and a cathode lead is connected to the anvil. Furthermore, an oscillator input lead is connected to the oscillator input and an oscillator output lead is connected to the oscillator output.

20 Claims, 1 Drawing Sheet

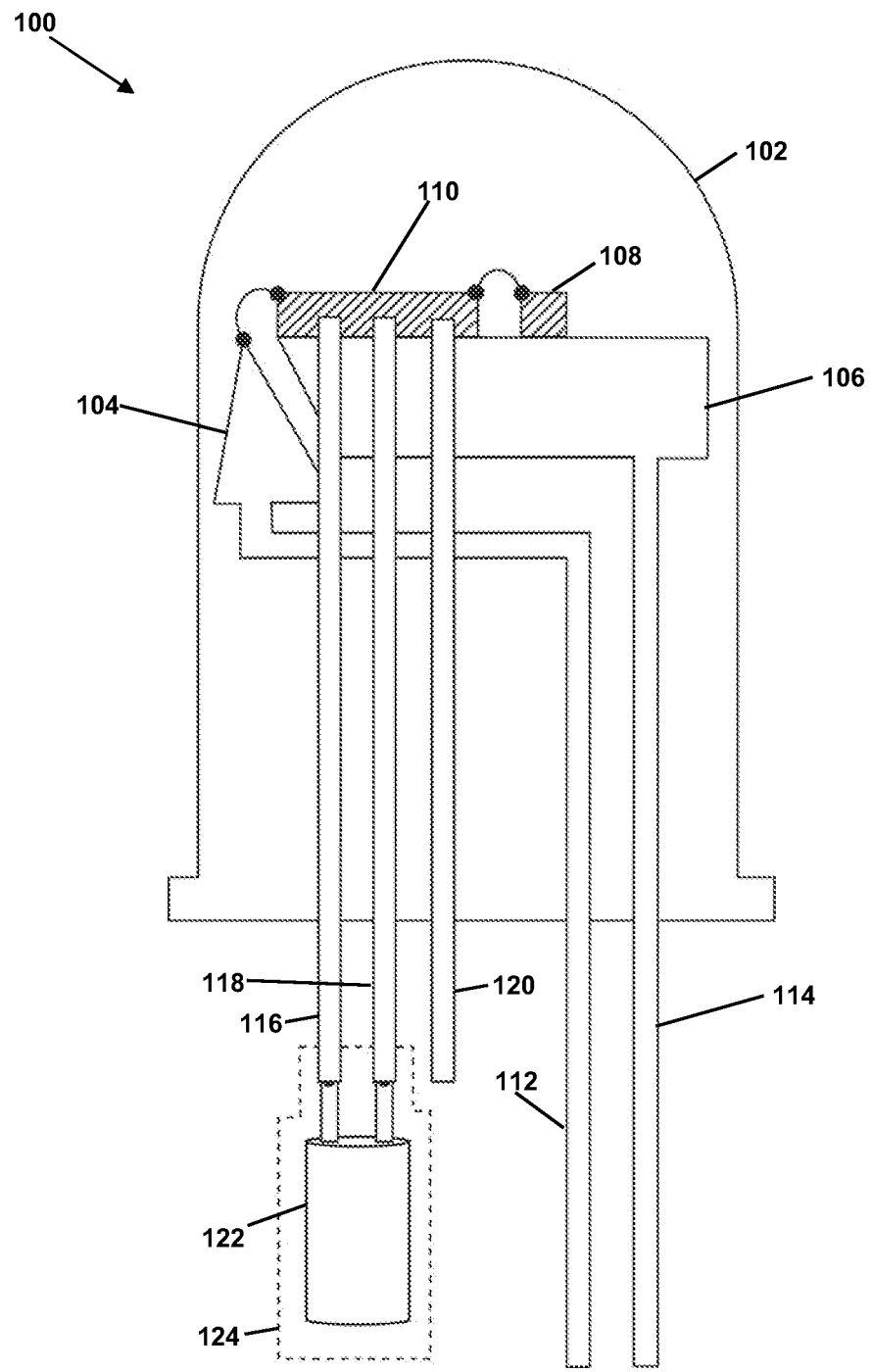

LIGHT EMITTING DIODE WITH OSCILLATOR

RELATED APPLICATIONS

[Not Applicable]

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Generally, the present application relates to light emitting diodes ("LED"). Particularly, the present application relates to the fabrication or integration of an LED and a crystal.

Generally speaking, an LED is a semiconductor light source. An LED assembly may contain an LED as well as other components. For example, an LED assembly may include an epoxy case that encompasses an LED and other components. For example, the case may encompass portions of conductive leads, additional LEDs (e.g., different colored LEDs), wire bonding, affiliated circuitry, or the like. The case may encompass timing circuitry to control the emission of light from the LED.

The encapsulated timing circuitry may a measure of instability and inaccuracy. As the length of timing periods increase, the effects of instability and inaccuracy of a timer become magnified. For example, an inaccuracy of a few seconds/hour may result in inaccuracies of many minutes, hours, or even days over extended periods of time. Such inaccuracy may limit the usefulness of a timer for particular applications.

BRIEF SUMMARY OF THE INVENTION

According to embodiments of the present invention, an LED assembly includes a case that encapsulates a post, an anvil and an integrated circuit. The integrated circuit includes positive and negative power supply inputs. The positive power supply input is electrically connected to the post, whereas the negative power supply input is electrically connected to the anvil. The integrated circuit also includes an oscillator input, and an oscillator output. According to these embodiments, an anode lead connected to the post; and a cathode lead is connected to the anvil. Furthermore, an oscillator input lead is connected to the oscillator input and an oscillator output lead is connected to the oscillator output.

According to certain embodiments, the LED assembly further includes an oscillator electrically connected between the oscillator input lead and the oscillator output lead. The oscillator may be outside of the case. Furthermore, insulating sheath may be provided around the oscillator, a portion of the oscillator input lead, and a portion of the oscillator output lead. According to certain embodiments, the oscillator comprises a crystal oscillator. According to certain embodiments, there is an epoxy outside of the case which is located to prevent the oscillator input lead from contacting the oscillator output lead.

According to certain embodiments, the integrated circuit is configured to cause a flickering light to be emitted from the LED. Also, the integrated circuit may be configured to turn the light on and off according to a timer loop. The timer may be, for example, a twenty-four hour timer. Additionally, the timer loop may have a power-on time and a power-off time, and the power-off time may be greater than the power-on time. The integrated circuit may include a microprocessor. According to certain embodiments, the LED assembly may further include an LED die electrically connected between the integrated circuit and the cathode.

Furthermore, there may be a first additional input lead electrically connected to a first additional input of the integrated circuit and extending out of the case. The first additional input may be configured to cause a timer loop to start or stop, and/or may be a serial communication input.

According to certain embodiments, the LED assembly includes a plurality of LEDs, such as different colored LEDs. The integrated circuit may be configured to independently control each of the LEDs. Furthermore, the integrated circuit may be configured to control a flickering of the plurality of the LEDs, as well as toggle a power to the plurality of LEDs. Power may be toggled according to a timer loop. The LED assembly may also include a first additional input lead electrically connected to a first additional input of the integrated circuit and the lead may extend out of the case. This input may be configured to cause the timer loop to start or stop.

BRIEF DESCRIPTION OF SEVERAL VIEWS OF THE DRAWINGS

FIG. 1 shows an LED assembly, according to embodiments of the present invention.

The foregoing summary, as well as the following detailed description of certain embodiments of the present invention, will be better understood when read in conjunction with the appended drawings. For the purposes of illustration, certain embodiments are shown in the drawings. It should be understood, however, that the claims are not limited to the arrangements and instrumentality shown in the attached drawings. Furthermore, the appearance shown in the drawings is one of many ornamental appearances that can be employed to achieve the stated functions of the system.

DETAILED DESCRIPTION OF THE INVENTION

FIG. 1 illustrates a LED assembly 100 according to embodiments of the present invention. The LED assembly 100 may include a case 102, a post 104, an anvil 106, an LED die 108, an integrated circuit 110, an anode lead 112, a cathode lead 114, an oscillator input lead 116, an oscillator output lead 118, additional lead(s) 120, and an oscillator 122.

The post 104 may be connected to the anode lead 112, and the anvil 106 may be connected to the cathode lead 114. An LED die 108 may be located above, and/or at least partially within a cavity of the anvil 106.

The integrated circuit 110 (or a portion thereof) may be located above the anvil 106. The integrated circuit 110 may be electrically connected to the post 104, for example, through a positive power supply input. The integrated circuit 110 may also have a negative power supply input electrically connected to the anvil 106 or the LED die 108. A case 102 may encapsulate the post 104, anvil 106, and integrated circuit 110.

The integrated circuit 110 may also have an oscillator input and an oscillator output. The integrated circuit 110 may have circuitry that is designed to set up an oscillator circuit, for example, with an external oscillator 122. Such an oscillator 122 may be a piezoelectric crystal or an "RC" circuit. The integrated circuit 110 may include a microprocessor. It should be understood that the term "microprocessor" includes variously-named devices or circuits that are capable of executing instructions stored in memory—e.g., microcontrollers or central processing units. The microprocessor may derive its clock from the oscillator circuit.

The integrated circuit 110 may be configured to cause a flickering light to be emitted from the LED. Such a flickering light may create the illusion of a candle. The integrated circuit 110 may also run a timer loop. The timer loop may be used to turn the light on and off. For example, the timer loop may have a duty cycle having a power-on time and a power-off time. To illustrate, the timer loop may be a 24 hour timer. The power-on time may be 5 hours and the power-off time may be 19 hours. If the timer loop starts at 12:00 PM, the light will be on until 5:00 PM and will then be off until 12:00 PM the next day.

In the case that the integrated circuit 110 includes a microprocessor, the microprocessor may execute instructions to cause the flickering and to run the timer loop. By operating the microprocessor using a clock derived from a crystal piezoelectric oscillator, it may be possible to have relatively accurate timer loops, such as a 24 hour timer.

The integrated circuit 110 may have additional input(s). These additional inputs may be connected to corresponding input leads 120 that extend out of the case 102. Such additional input(s) could be used to cause the timer loop to start or stop. The additional input(s) could be implemented as a serial communication port. In the case of the integrated circuit 110 including a microprocessor, the serial communication input could be used to flash the memory of the microprocessor— effectively changing its firmware. The additional input(s) could be implemented to change a flickering mode, or to change one or more colors of the LED. The additional input(s) may also be implemented to alter the timer loop, for example, the duration or duty cycle of the timer loop.

An oscillator input lead 116 may be connected to the oscillator input, and an oscillator output lead 118 may be connected to the oscillator output. An oscillator 122 (e.g., a can-type crystal oscillator) may be connected between the oscillator input lead 116 and the oscillator output lead 118. The oscillator 122 may be located, for example, outside of the case 102. The oscillator 122 may be electrically connected to the oscillator input and output leads 116, 118, for example by direct soldering. As another option, the oscillator 122 may be mounted or soldered to pads on a printed circuit board. The oscillator input leads 116, 118 may be mounted or soldered to different pads on the circuit board. Traces may connect these pads, thereby electrically connecting the oscillator 122 to the oscillator input and output leads 116, 118.

In order to protect the oscillator 122, an insulating sheath 124 (e.g., a heat-shrink sheath) may be used to insulate (e.g., electrically, thermally, or mechanically) the oscillator 122. The sheath 124 may also cover portions of the oscillator input 116 and output 118 leads. An epoxy may be applied outside of the case 102. The epoxy may be applied and located to prevent the oscillator input lead 116 from contacting the oscillator output lead 118.

The LED assembly 100 may also include an LED die 108 electrically connected between the integrated circuit 110 and the cathode. Additionally, the LED assembly 100 may have a plurality of LEDs, such as LEDs that emit different colored lights. In such a configuration, the integrated circuit 110 may be configured to independently control each of the plurality of LEDs—either separately, or in combination, or a mix thereof. Similar to the discussion above, the integrated circuit 110 may be configured to control a flickering of the plurality of LEDs and/or to toggle a power to the plurality of LEDs according to a timer loop. Also, the implementation and configuration of additional input(s) (and corresponding leads) to the integrated circuit 110 may also be applied to an assembly with multiple LEDs.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

The invention claimed is:

1. A light emitting diode ("LED") assembly comprising:
a case encapsulating a post, an anvil, and an integrated circuit, wherein the integrated circuit includes:
a positive power supply input electrically connected to the post,
a negative power supply input electrically connected to the anvil,
an oscillator input, and
an oscillator output;
an anode lead connected to the post;
a cathode lead connected to the anvil;
an oscillator input lead connected to the oscillator input; and
an oscillator output lead connected to the oscillator output.

2. The LED assembly of claim 1, further comprising an oscillator connected between the oscillator input lead and the oscillator output lead.

3. The LED assembly of claim 2, wherein the oscillator is outside of the case.

4. The LED assembly of claim 2, further comprising an insulating sheath around the oscillator, a portion of the oscillator input lead, and a portion of the oscillator output lead.

5. The LED assembly of claim 2, wherein the oscillator comprises a crystal oscillator.

6. The LED assembly of claim 2, further comprising an epoxy outside of the case and located to prevent the oscillator input lead from contacting the oscillator output lead.

7. The LED assembly of claim 1, wherein the integrated circuit is configured to cause a flickering light to be emitted from the LED.

8. The LED assembly of claim 7, wherein the integrated circuit is configured to turn the light on and off according to a timer loop.

9. The LED assembly of claim 8, wherein the timer loop comprises a twenty-four hour timer loop.

10. The LED assembly of claim 8, wherein the timer loop comprises a power-on time and a power-off time, wherein the power-off time is greater than the power-on time.

11. The LED assembly of claim 8, wherein the integrated circuit comprises a microprocessor.

12. The LED assembly of claim 1, further comprising an LED die electrically connected between the integrated circuit and the cathode.

13. The LED assembly of claim 1, further comprising a first additional input lead electrically connected to a first additional input of the integrated circuit and extending out of the case.

14. The LED assembly of claim 13, wherein the first additional input is configured to cause a timer loop to start or stop.

15. The LED assembly of claim 13, wherein the first additional input of the integrated circuit comprises a serial communication input.

16. The LED assembly of claim 1, comprising a plurality of LEDs.

17. The LED assembly of claim 16, wherein each LED emits a different colored light.

18. The LED assembly of claim 16, wherein the integrated circuit is configured to independently control each of the plurality of LEDs.

19. The LED assembly of claim 18, wherein the integrated circuit is configured to control a flickering of the plurality of LEDs and to toggle a power to the plurality of LEDs according to a timer loop.

20. The LED assembly of claim 19, further comprising a first additional input lead electrically connected to a first additional input of the integrated circuit and extending out of the case, wherein the first additional input is configured to cause the timer loop to start or stop.

* * * * *